United States Patent [19]

Seppälä

[11] Patent Number: 5,390,361
[45] Date of Patent: Feb. 14, 1995

[54] METHOD AND A DEVICE FOR CONTROLLING A RADIO TRANSMITTER

[75] Inventor: Seppo Seppälä, Oulu, Finland

[73] Assignee: Nokia Telecommunications Oy, Espoo, Finland

[21] Appl. No.: 945,653

[22] PCT Filed: May 3, 1992

[86] PCT No.: PCT/FI92/00064
§ 371 Date: Nov. 3, 1992
§ 102(e) Date: Nov. 3, 1992

[87] PCT Pub. No.: WO92/16058
PCT Pub. Date: Sep. 17, 1992

[30] Foreign Application Priority Data

Mar. 6, 1991 [FI] Finland ................... 911135

[51] Int. Cl.6 ............................................. H04B 1/02
[52] U.S. Cl. ................................. 455/126; 455/127
[58] Field of Search ............. 455/127, 126, 119, 38.3, 455/116; 370/95.3; 375/71, 63, 72, 70, 73

[56] References Cited

FOREIGN PATENT DOCUMENTS 0416613 3/1991 European Pat. Off. .
0193724 8/1988 Japan ..................... 455/127

Primary Examiner—Curtis Kuntz
Assistant Examiner—Doris To
Attorney, Agent, or Firm—Cushman Darby & Cushman

[57] ABSTRACT

A method and a device for controlling a radio transmitter. In the method, the radio transmitter is alternately caused to assume an ON state in which a desired outbound RF power is transmitted, and an OFF state in which no RF power is transmitted, the RF power being determined in the ON state by using a power control signal ($V_c$) controlling the amplification of transmitter amplifiers (3, 4). For ensuring that the data period falls within the useful period of the transmitter, within which the value of the RF power to be transmitted is constant, a data stream (D2) is delayed with respect to the power control ($V_c$) when the transmitter is caused to assume the ON state.

5 Claims, 1 Drawing Sheet

METHOD AND A DEVICE FOR CONTROLLING A RADIO TRANSMITTER

BACKGROUND OF THE INVENTION

The invention relates to a method and a device for controlling a radio transmitter. In the method, the radio transmitter is alternately caused to assume an ON state in which a desired outbound RF power is transmitted, and an OFF state in which no RF power is transmitted, the RF power being determined in the ON state by means of a power control signal controlling the amplification of transmitter amplifiers. The device according to the invention provides a means for practicing the methods.

The method and the device according to the invention are intended for use in the base station of the GSM mobile radio network, but it is equally applicable to radio systems of other types in which the transmitter is keyed on the basis of varying transmission requirements. The advantage to be gained from the arrangement according to the invention is greatest in systems based on time-division multiplexing, in which high requirements are set on the transmission rate.

The GSM radio system utilizes dynamic control of transmitting power both at the base station and at mobile stations. The power control word comprises four bits, which means that there are 16 power levels available. The spacing between two successive power levels is 2 dB, and so the entire power control range is 30 dB. In a so-called TX-on time slot, in which the transmission takes place, the transmitting power is adjusted in each time slot of the frame to one of the 16 different power levels in accordance with the above-mentioned power control word. A so-called TX-off time slot, in turn, is a time slot in which no transmission occurs (the RF power is zero). In this connection, EP Patent Application 414352 A2 is referred to, which describes in more detail both the GSM system and a radio transmitter belonging to it, the transmitting power of the radio transmitter being adjustable in the TX-on time slot to one of the above-mentioned 16 power levels.

At the beginning of the transmitting time slot (TX-on), the transmitter power increases with a predetermined delay as compared with the power control voltage, whereas the data stream in the transmitter is not delayed in the same proportion. Therefore, there is the risk that the first data bits are transmitted at the beginning of the transmitting time slot before a full transmitter power is achieved. Correspondingly, wrong bits may be transmitted at the end of the transmitting time slot at full transmitter power.

SUMMARY OF THE INVENTION

The object of the present invention is to provide a method and a device by means of which it can be ensured that the data period falls within the useful period of the transmitter, within which the value of the outbound RF power is constant. This is achieved by means of a method according to the invention in such a way that a data stream is delayed with respect to the power control when the transmitter is caused to assume the ON state. The device according to the invention in turn provides a means for practicing the method.

In practicing the method of the invention, the data stream is delayed with respect to the power control so that it can be ensured that the outbound data will fall entirely within the useful period of the transmitter.

BRIEF DESCRIPTION OF THE INVENTION

In the following, the invention is described in more detail with reference to the examples shown in the attached drawings, wherein:

FIG. 1 is a simplified block diagram illustrating the transmitter of a base station in the GSM system in aspects relevant to the invention; and FIG. 2 shows a more detailed realization of a delay circuit according to the invention.

DETAILED DESCRIPTION

Figure 1:
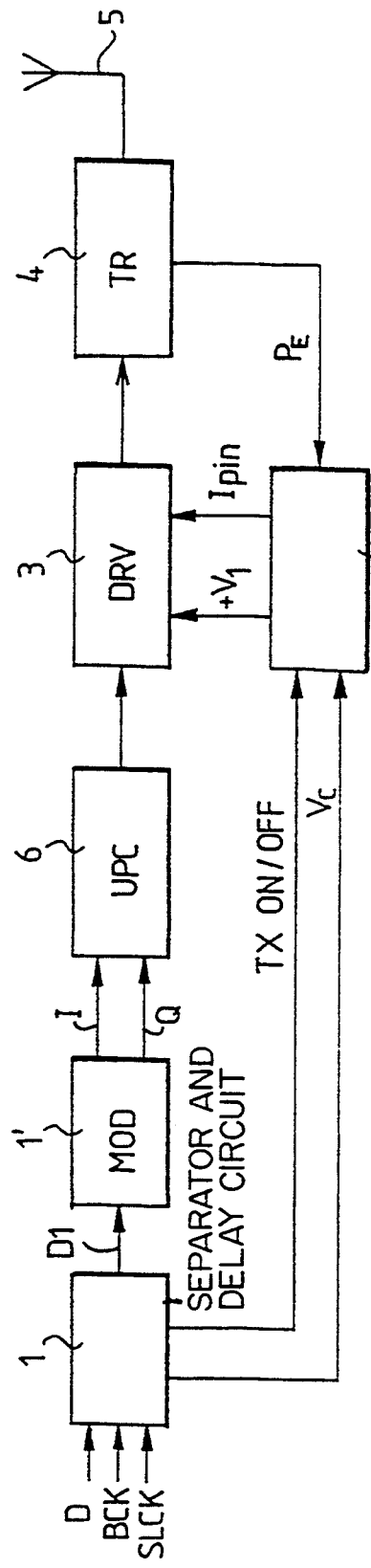

FIG. 1 shows a simplified block diagram illustrating the transmitter of a GSM base station in aspects relevant to the present invention. The reference numeral 1 indicates a separator and delay circuit to the inputs of which a digital data signal D is applied. In addition, a byte clock BCK and a time slot clock SLCK are coupled to the separator and delay circuit for the synchronization of the system (the byte clock is an internal clock of the transmitter having a duration of 20 pulses at the beginning of each time slot, that is, the byte clock breaks the data applied to the separator circuit into bytes; and the time slot clock is a clock which generates one pulse per time slot so that it is high during the pulses generated by the byte clock). Data about the desired power level in each particular case is included in the digital data signal D. In the separator and delay circuit 1, the power level data is separated and converted into an analog power control voltage $V_c$ corresponding to the level in question. The power control voltage $V_c$ is then applied to a power control unit 2 of the transmitter. In the power control unit the power control voltage $V_c$ is converted into a current $I_{pin}$ by means of which the amplification of a preamplifier 3 of the transmitter is controlled. The preamplifier 3 is connected to a power amplifier 4 of the transmitter, which power amplifier applies RF power to a transmitting antenna 5. TX on/-off data separated from the data stream is also applied from the separator and delay circuit 1 to the power control unit 2, which breaks off a voltage $+V_1$ to the preamplifier in a TX off situation. A serial data signal D1 which no longer contains power level data is applied by the separator and delay circuit to a quadrature modulator 1' generating I and Q components which are applied to an up-converter 6 which converts the signals to a higher frequency and applies them further to the preamplifier 3. The power amplifier 4 also provides data on a forward power $P_E$ for the power control unit 2, so that the power control can be adapted to amplification changes occurring, e.g., at transistor stages.

Figure 2:
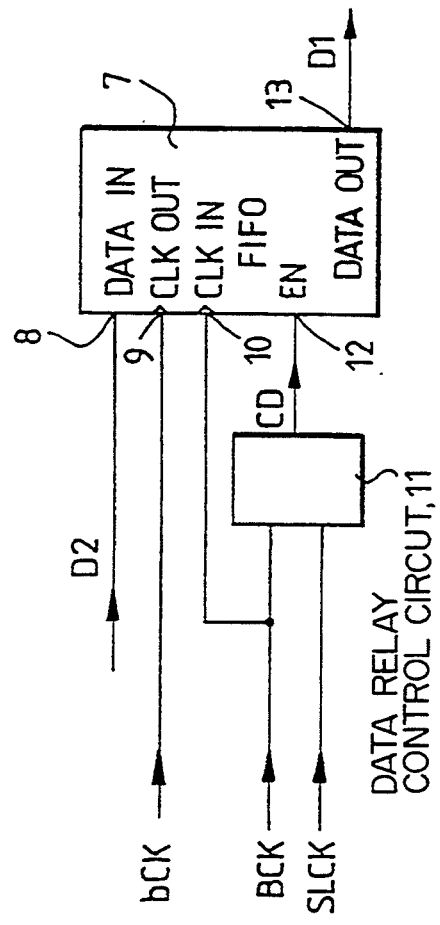

FIG. 2 shows more closely how the separator and delay circuit 1 effects the delaying of data. An inbound data stream D2, from which the power level data has already been separated, is connected directly to a data input 8 of a first in first out memory (FIFO) 7, and a bit clock signal bCK of the system correspondingly to a clkout pin 9 of the first in first out memory. The byte clock BCK is connected to a clock input pin (clkin) 10 of the first in first out memory and to a data delay control circuit 11 to which the time slot clock SLCK is also connected. An output signal CD from the delay control circuit 11 is coupled to an output enable pin 12 of the first in first out memory 7, and a data output 13 of the first in first out memory 7 is coupled to the quadrature modulator 1' for applying the data signal D1 to the modulator.

The control signal CD is generated by means of the byte clock and the time slot clock in the delay control circuit 11, and it is used to delay the output signal of the first in first out memory, that is, the data stream D1 to the modulator, so that the data stream will fall within the useful period of the transmitter (which is 148 bits in duration in the GSM system).

The delay control circuit can be effected by conventional random logic, and it can be combined with delay adjustment. More accurate circuit and operational diagrams are not shown, as each manufacturer can use its own internal synchronization signals, by means of which one skilled in the art can easily realize a simple delay operation.

Even though the invention has been described above with reference to the example shown in the attached drawings, it is obvious that the invention is not restricted to it, but it can be modified in many ways within the inventive idea defined in the attached claims. In principle, the delay of the data stream could also be effected in the modulator; however, the realization of the delay is easier in a digital stage than in an analog modulator.

I claim:

1. A method for controlling a radio transmitter that is alternately caused to assume an ON state, during which RF power is transmitted from an antenna thereof, and an OFF state in which said RF power is not transmitted from said antenna of said transmitter, for ensuring that a unit of data which is to be transmitted while said transmitter is operating in a respective instant of said ON state, is delayed from being supplied to the transmitter, until a level of said RF power being transmitted from the transmitter in the respective ON state instant is expected to have achieved a threshold level which is sufficient for adequately transmitting all of said unit of data, said method comprising:
(a) for initiating each temporally successive transmission of a respective unit of data, sending towards an input of the transmitter, along respective circuitry effectively connected therewith,
   (i) a data stream of the respective unit of data, and
   (ii) a power control signal for causing the transmitter to terminate an existing OFF state instant thereof and, instead, assume an ON state instant thereof;
(b) after step (a) has been initiated, but before step (a) has resulted in the respective unit of data effectively reaching the transmitter via said respective circuitry for transmission by said transmitter, imposing a temporal delay on said data stream within said respective circuitry, of a sufficient magnitude that, when said data stream effectively reaches said transmitter, said transmitter has already achieved said threshold level and sufficient time remains for said transmitter to transmit all of the respective said unit of data before said transmitter next reverts to said OFF state thereof.

2. The method of claim 1, wherein:
said respective circuitry includes a FIFO memory and into which said data stream is input and from which said data stream is output, and said temporal delay is imposed by temporally delaying output of said data stream from said FIFO memory relative to input of said data stream to said FIFO memory, by a delay having said sufficient magnitude.

3. The method of claim 2, wherein:
step (b) comprises serving said FIFO memory with a data relay control circuit driven by a clock signal which starts as step (a) begins, which data relay control signal effectively prevents output of said data stream from said FIFO memory until a preselected temporal delay is determined by said data relay control circuit by counting increments of said clock signal.

4. A device for controlling a radio transmitter that, in use, is alternately caused to assume an ON state, during which RF power is transmitted from an antenna thereof, and an OFF state in which said RF power is not transmitted from said antenna of said transmitter, for ensuring that a unit of data which is to be transmitted while said transmitter is operating in a respective instant of said ON state, is delayed from being supplied to the transmitter, until a level of said RF power being transmitted from the transmitter in the respective ON state instant is expected to have achieved a threshold level which is sufficient for adequately transmitting all of said unit of data, said device comprising:
(a) for initiating each temporally successive transmission of a respective unit of data, means for sending towards an input of the transmitter, along respective circuitry effectively connected therewith,
   (i) a data stream of the respective unit of data, and
   (ii) a power control signal for causing the transmitter to terminate an existing OFF state instant thereof and, instead, assume an ON state instant thereof;
(b) means operable after said sending has been initiated, but before said sending has resulted in the respective unit of data effectively reaching the transmitter via said respective circuitry for transmission by said transmitter, for imposing a temporal delay on said data stream within said respective circuitry, of a sufficient magnitude that, when said data stream effectively reaches said transmitter, said transmitter has already achieved said threshold level and sufficient time remains for said transmitter to transmit all of the respective said unit of data before said transmitter next reverts to said OFF state thereof.

5. The device of claim 4, wherein:
said respective circuitry includes a FIFO memory into which, in use, said data stream is input and from which, in use, said data stream is output;
a data relay control circuit serving said FIFO memory, said data relay control circuit being arranged to be driven, in use, by a clock signal which starts as said sending begins, which data relay control signal effectively prevents output of said data stream from said FIFO memory until a preselected temporal delay is determined by said data relay control circuit by counting increments of said clock signal, wherein said temporal delay is imposed by temporally delaying output of said data stream from said FIFO memory relative to input of said data stream to said FIFO memory, by a delay having said sufficient magnitude.

* * * * *

UNITED STATES PATENT AND TRADEMARK OFFICE
CERTIFICATE OF CORRECTION

PATENT NO. : 5,390,361
DATED : February 14, 1995
INVENTOR(S) : SEPPALA, Seppo

It is certified that error appears in the above-indentified patent and that said Letters Patent is hereby corrected as shown below:

On the title page: under Item [22], correct "PCT Filed:" to read --March 5, 1992 --.

Signed and Sealed this

Twenty-fifth Day of April, 1995

*Attest:*

BRUCE LEHMAN

*Attesting Officer*     *Commissioner of Patents and Trademarks*